(12) United States Patent
Liu et al.

(10) Patent No.: US 6,169,041 B1
(45) Date of Patent: Jan. 2, 2001

(54) METHOD FOR ENHANCING THE RELIABILITY OF A DIELECTRIC LAYER OF A SEMICONDUCTOR WAFER

(75) Inventors: Tien-Jui Liu, Tai-Chung Hsien; Chun-Huang Chen, Chia-I Hsien, both of (TW)

(73) Assignee: United Microelectronics Corp., Hsin-Chu (TW)

(*) Notice: Under 35 U.S.C. 154(b), the term of this patent shall be extended for 0 days.

(21) Appl. No.: 09/431,941

(22) Filed: Nov. 1, 1999

(51) Int. Cl.⁷ ...................................................... H01L 21/31
(52) U.S. Cl. ............................ 438/778; 438/763; 438/954
(58) Field of Search ................................... 438/763, 778, 438/954

(56) References Cited

U.S. PATENT DOCUMENTS 4,818,711  *  4/1989  Choksi et al. ........................ 437/21

* cited by examiner

Primary Examiner—John F. Niebling
Assistant Examiner—Alexander G. Ghyka
(74) Attorney, Agent, or Firm—Winston Hsu

(57) ABSTRACT

The present invention provides a method for enhancing the reliability of a dielectric layer of a semiconductor wafer. The dielectric layer is formed above a silicon element. First, the method implants argon ions with a dosage of around $10^{15}$~$10^{16}$ ions/cm$^3$ and an energy of around 3~50 KeV into the silicon element to form an ion implantation layer. Then, the dielectric layer is formed on a predetermined area of the silicon element. The ion implantation layer prevents oxygen ions, impurities and charge carriers from converging on the surface of the silicon element so as to enhance the reliability of the dielectric layer.

4 Claims, 3 Drawing Sheets

METHOD FOR ENHANCING THE RELIABILITY OF A DIELECTRIC LAYER OF A SEMICONDUCTOR WAFER

BACKGROUND OF THE INVENTION

1. Field of the Invention

The present invention relates to a method for enhancing the reliability of a dielectric layer of a semiconductor wafer, and more particularly, to a method for enhancing the reliability of a dielectric layer above a silicon element.

2. Description of the Prior Art

In general, one or more dielectric layers are formed between two conductors of a semiconductor wafer to provide good isolation. If there are impurities or charge carriers inside the dielectric layer, dielectric breakdown can easily occur, adversely affecting the reliability and lifetime of the semiconductor components. Consequently, each dielectric layer must be carefully fabricated to ensure the highest quality. To enhance the reliability of the dielectric layer, not only does the process for forming the dielectric layer need to be improved, but the effect of conductors adjacent to the dielectric layer, and other fabrication processes, must also be considered.

Please refer to FIG. 1. FIG. 1 is a cross-sectional diagram of a gate oxide 14 formed on a semiconductor wafer 10 according to the prior art. The surface of the semiconductor wafer 10 comprises a substrate layer 12 formed of single-crystal silicon, a gate oxide 14 formed of silicon oxide ($SiO_2$) on a predetermined area of the surface of the semiconductor wafer 10, and a gate 16 formed above the gate oxide 14.

Because many unsaturated bonds are formed along the interface between the substrate layer 12 and the gate oxide 14, impurities or oxygen ions ($O_2$) (20) may diffuse upward to the surface of the substrate layer 12. These impurities and oxygen ions can diffuse through the interface between the substrate layer 12 and the gate oxide 14 to form a trap region 18 during subsequent semiconductor processes. The trap region 18 may trap electron-hole pairs (EHP) generated in the substrate layer 12, degrading the quality of the gate oxide 14 to such an extent that current may easily pass through it. In FIG. 1, circles 20 show the impurities or oxygen ions in the substrate layer 12, and arrows 22 show the diffusion directions of the impurities or oxygen ions.

Please refer to FIG. 2. FIG. 2 is a cross-sectional diagram of a dielectric layer 38 formed within a capacitor 34 on a semiconductor wafer 30 according to the prior art. The capacitor 34 is formed in a predetermined area on the surface of the semiconductor wafer 30. The capacitor 34 comprises a storage node 36 formed of poly-silicon, a dielectric layer 38 formed of an ONO (oxide-nitride-oxide) complex structure, and an upper field plate 40 formed of poly-silicon.

The poly-silicon layer of the storage node 36 is formed of a large number of single crystal silicon grains with different crystal orientations. Neighboring silicon grains with different crystal orientations form a grain boundary between them. Each grain boundary connects to another to form a mesh-like structure. Charge carriers move easily along the particular directions of the grain boundaries. As a consequence of this, when a current enters the storage node 36, the current converges in some areas between the dielectric layer 38 and the storage node 36. The current density may be so high in these areas that the crystalline structure of the dielectric layer 38 can be damaged, negatively impacting the lifetime of the dielectric layer 38 and the reliability of the capacitor 34. In FIG. 2, arrows 42 show the direction of current in the semiconductor wafer 30, and arrows 44 show the various directions of current in the storage node 36.

SUMMARY OF THE INVENTION

It is therefore a primary objective of the present invention to provide a method for enhancing the reliability of a dielectric layer of a semiconductor wafer to prevent impurities, oxygen ions and currents from converging at the surface of the silicon element below the dielectric layer so as to solve the above mentioned problems.

In a preferred embodiment, the present invention provides a method for enhancing the reliability of a dielectric layer of a semiconductor wafer. The surface of the semiconductor wafer comprises a substrate layer. The method comprises performing an ion implantation process on the surface of the semiconductor wafer to implant argon ions with a dosage around $10^{15}$~$10^{16}$ ions/cm$^3$ and an energy around 3~50 KeV into a region for a thickness of 500 Å to form an ion implantation layer; and forming a gate oxide formed of silicon oxide on a predetermined area of the region;

wherein the ion implantation layer is used to prevent oxygen ions ($O_2^-$) and impurities from diffusing upward from the substrate layer so as to enhance the reliability of the gate oxide.

It is an advantage of the present invention that the method uses argon ions to form a barrier layer so that the dielectric layer is shielded from oxygen ions and impurities, thereby enhancing the reliability of the dielectric layer.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERED EMBODIMENT

The present invention provides a method for enhancing the reliability of a dielectric layer of a semiconductor wafer. The dielectric layer serves as a gate oxide. The method according to the present invention uses electrically neutral argon atoms (Ar) to form a barrier layer against oxygen ions and impurities in the semiconductor wafer. This barrier layer prevents oxygen ions and impurities in the substrate layer from diffusing upward to the surface of the substrate layer, and thus enhances both the reliability of the gate oxide and the electrical performance of the gate.

Figure 1:
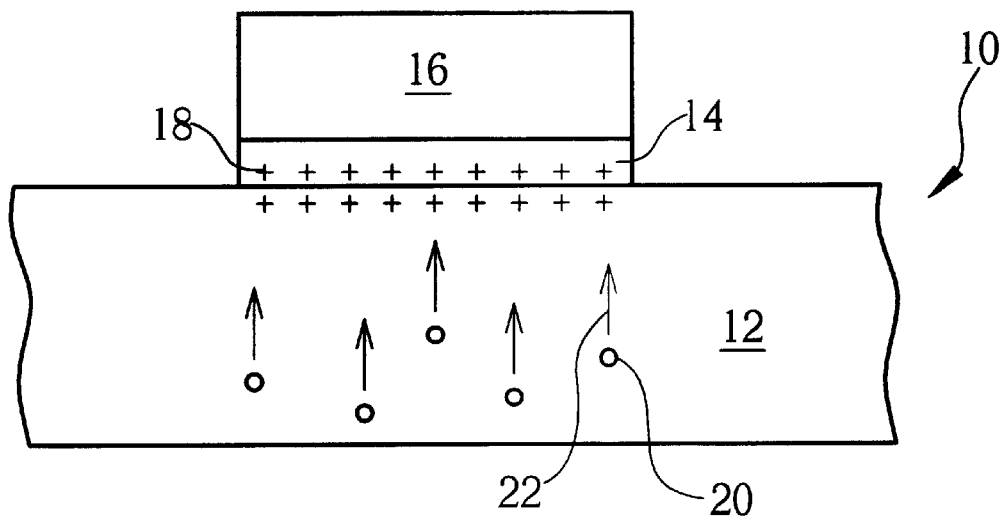
FIG. 1 is a cross-sectional diagram of a gate oxide formed on a semiconductor wafer according to the prior art.
Figure 2:
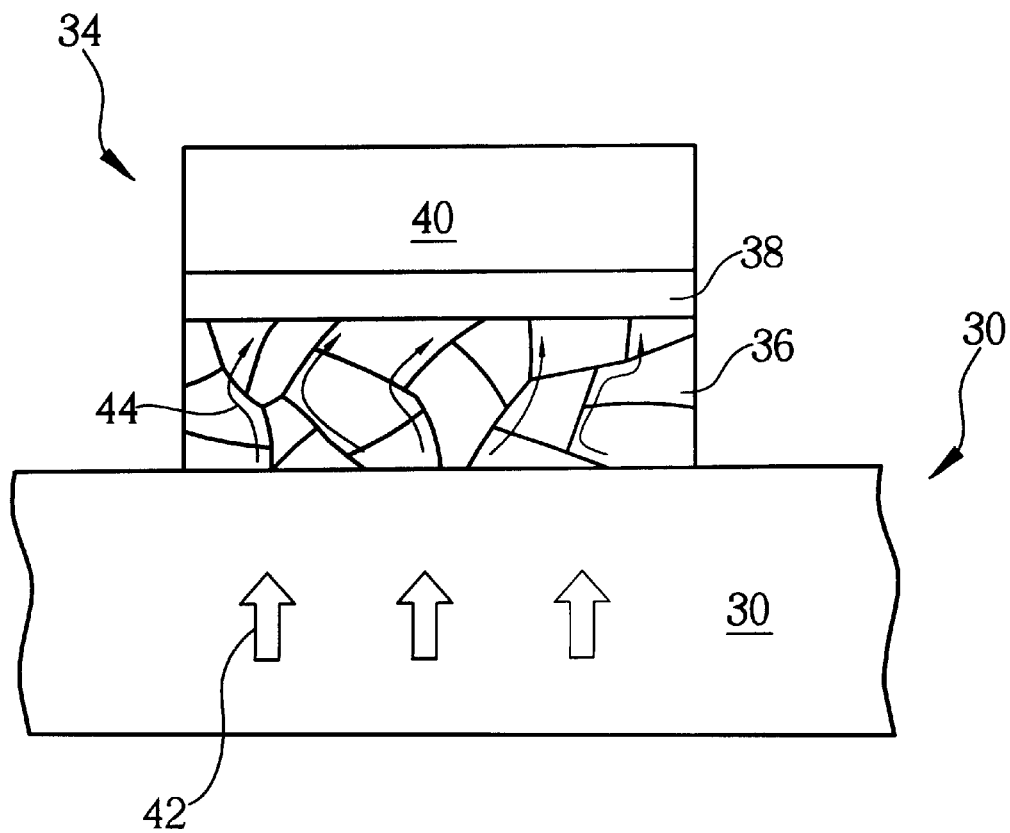
FIG. 2 is a cross-sectional diagram of a dielectric layer formed above a capacitor on a semiconductor wafer according to the prior art.
Figure 3:
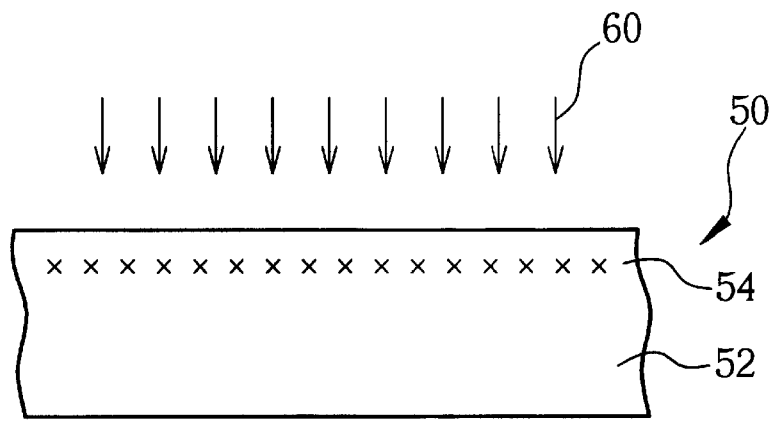
FIG. 3 and FIG. 4 are cross-sectional diagrams of forming a gate oxide on a semiconductor wafer according to the present invention.
Figure 4:
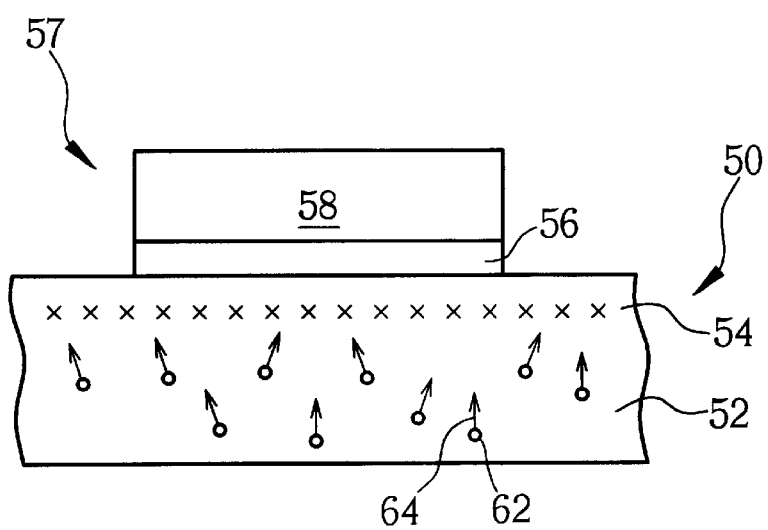

Please refer to FIG. 3 and FIG. 4. FIG. 3 and FIG. 4 are cross-sectional diagrams of forming the gate oxide 56 on the semiconductor wafer 50 according to the present invention. As shown in FIG. 3, the surface of the semiconductor wafer 50 comprises a substrate layer 52 formed of single-crystal silicon. First, the invention method performs an ion implantation process 60 on the surface of the semiconductor wafer 50 to implant argon ions into a region so as to form an ion implantation layer 54. The argon ions of the ion implantation layer 54 are uniformly distributed from the surface of the substrate layer 52 to a thickness of 500 angstroms (Å). In the ion implantation process, the dosage is around $10^{15}$~$10^{16}$ ions/cm$^3$ and the implantation energy is around 3~50 KeV.

In FIG. 3, arrows 60 show the implantation direction of argon ions in the ion implantation process.

As shown in FIG. 4, a chemical vapor deposition (CVD) process is next employed to deposit a silicon oxide layer (not shown) and then a poly-silicon layer (not shown) on the surface of the substrate layer 52. A gate 57 is formed using a lithographic process and an etching process to leave the gate oxide 56 and a gate conductive layer 58 above the gate oxide 56 in a predetermined area on the surface of the substrate layer 52. In FIG. 4, circles 62 show oxygen ions or impurities in the substrate layer 52 and arrows 64 show the directions of oxygen ions or impurities diffusing towards the ion implantation layer 54.

The method according to the present invention forms the ion implantation layer 54 by implanting argon ions to act as the barrier layer against oxygen ions and impurities. The barrier layer effectively obstructs or catches oxygen ions and impurities in the substrate layer 54, and prevents them from diffusing upward. Thus, the gate oxide 56 is shielded from oxygen ions and impurities so as to enhance the reliability of the dielectric layer (the gate oxide 56) on the semiconductor wafer 50.

Figure 5:
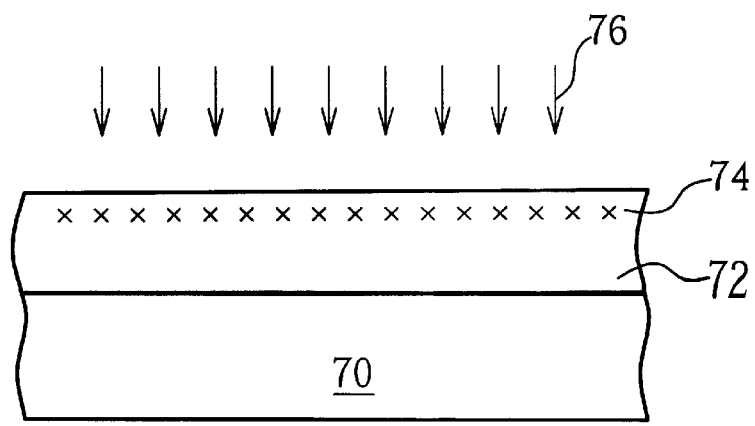
FIG. 5 through FIG. 7 are cross-sectional diagrams of forming a dielectric layer of a capacitor on the surface of a storage node according to the present invention.
Figure 6:
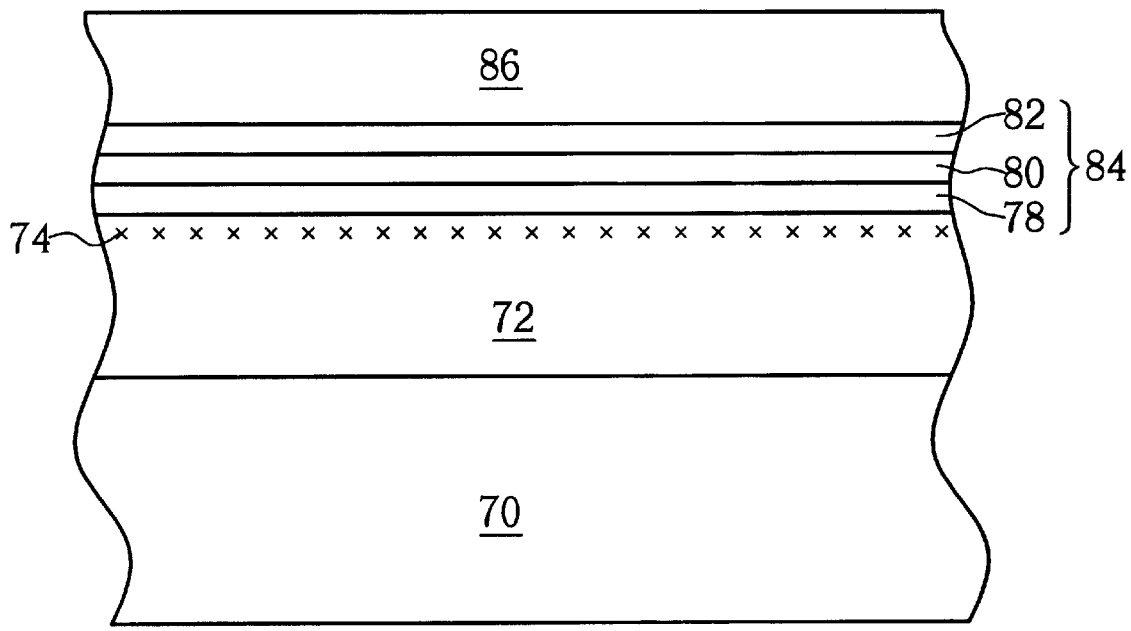
Figure 7:
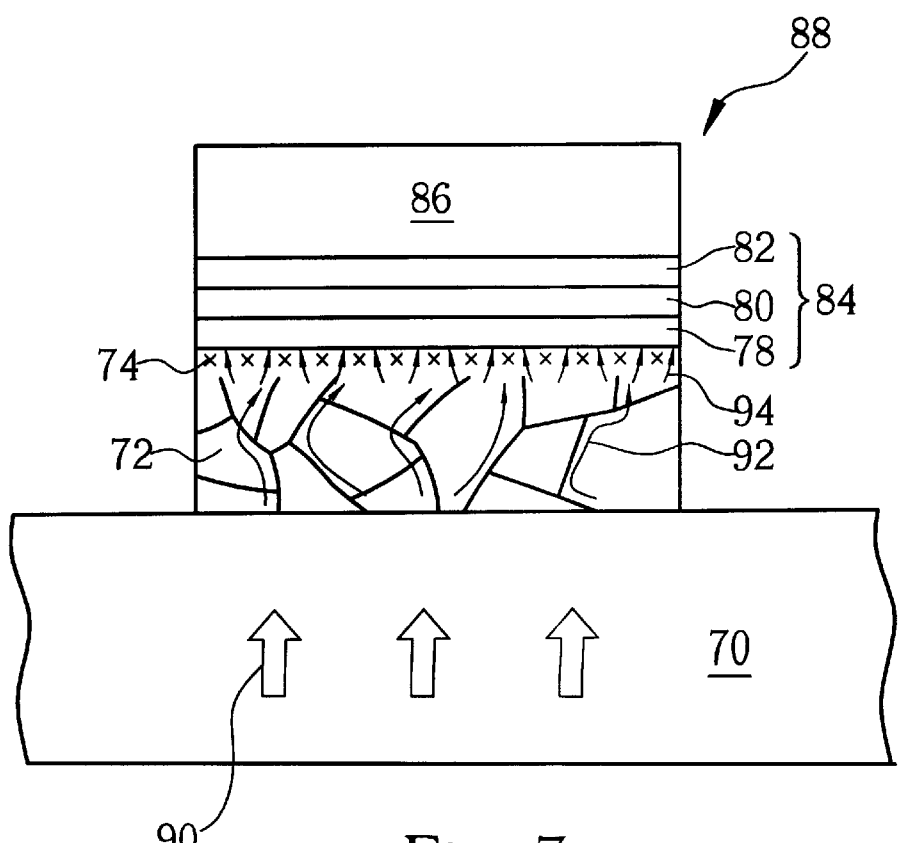

Please refer to FIG. 5 through FIG. 7. FIG. 5 through FIG. 7 are cross-sectional diagrams of forming a dielectric layer 84 of a capacitor 88 on the surface of a storage node 72 according to the present invention. As shown in FIG. 5, the storage node 72 of poly-silicon is formed on the surface of a semiconductor wafer 70. First, the invention method performs an ion implantation process on the surface of the storage node 72 to implant argon ions into the surface of the storage node 72 so as to form an ion implantation layer 74. The argon ions of the ion implantation layer 74 are uniformly distributed. The dosage is around $10^{15} \sim 10^{16}$ ions/cm$^3$ with an implantation energy of around 3~50 KeV in the ion implantation process. In FIG. 5, arrows 76 show the implantation direction of argon ions in the ion implantation process.

As shown in FIG. 6, a CVD process is then employed to deposit a first silicon oxide layer 78, a silicon nitride layer 80 and a second silicon oxide layer 82, sequentially, so as to form the dielectric layer 84 of an ONO (oxide-nitride-oxide) complex structure. A CVD process follows to deposit a poly-silicon layer which serves as an upper field plate 86 above the dielectric layer 84. FIG. 7 depicts the capacitor 88 after its position has been defined by a photolithographic process, and its final form realized by an etching process.

As shown in FIG. 5 through FIG. 7, the method for enhancing the reliability of the dielectric layer 84 of the capacitor 88 employs an ion implantation process to destroy the surface crystal lattice structure of the poly-silicon layer of the storage node 72. Thus, the poly-silicon structure on the surface of the storage node 72 is transformed to an amorphous silicon structure, or a fine-grain structure. These structures prevent charge carriers from flowing along the grain boundaries of poly-silicon or converging on these boundaries so that the reliability of the dielectric layer 84 is enhanced. Furthermore, the argon ions are uniformly distributed in the ion implantation layer 74 and prevent the poly-silicon grains on the surface of the storage node 72 from re-crystallizing in the subsequent manufacturing processes, thereby maintaining the fine-grain structure on the surface of the storage node 72 of the capacitor 88.

As shown in FIG. 7, when a current enters the storage node 72 through the semiconductor wafer 70, the current first flows upward along the grain boundaries of the poly-silicon. Then, the current is scattered in the ion implantation area 74 to form several smaller currents that flow along the grain boundaries of the fine-grain structure. Therefore, the current is uniformly transmitted upward. Arrows 90, 92 and 94 show the directions of the current flowing in the semiconductor wafer 70, in the poly-silicon structure of the storage node 72 and in the fine-grain structure of the ion implantation area 74, respectively.

In contrast to the prior art method for forming a dielectric layer on a semiconductor wafer, the method according to the present invention employs ion implantation technology to implant ions of inert gas with a proper dosage and energy into the surface of the silicon element. The ions are uniformly distributed in the surface of the silicon element with a predetermined thickness to form a stress field. When this stress field is employed in a single crystal substrate layer, the stress field obstructs or catches oxygen ions and impurities, preventing them from diffusing upward and thus improving the quality of the gate oxide. When the stress field is employed in a poly-silicon layer, the stress field changes the flow of charge carriers so that current uniformly flows through the stress field instead of along poly-silicon grain boundaries. Thus, the method according to the present invention utilizes the implantation of argon ions to enhance the reliability of a dielectric layer formed on a silicon element so as to increase both the lifetime and yield of the products.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method for forming a dielectric layer of a capacitor on a surface of a storage node of the capacitor, the storage node being formed of polysilicon on the surface of the semiconductor wafer, the method comprising:

performing an ion implantation process on the surface of the storage node of the capacitor to implant ions with a predetermined dosage into the surface of the storage node of the capacitor to form an ion implantation layer; and forming the dielectric layer of the capacitor on the surface of the storage node of the capacitor;

wherein the ion implantation process destroys the crystal lattice structure on the surface of the storage node of the capacitor to form an amorphous silicon structure or a fine-grain structure on the surface of the storage node of the capacitor.

2. The method of claim 1 wherein the dielectric layer of the capacitor is formed of an ONO (oxide-nitride-oxide) complex structure.

3. The method of claim 1 wherein the ions which are uniformly distributed in the ion implantation layer for preventing the polysilicon grains on the surface of the storage node of the capacitor from re-crystallizing so as to form the fine-grain structure on the surface of the storage node of the capacitor.

4. The method of claim 1 wherein the ions are argon ions (Ar), and the predetermined dosage of the ion implantation process is around $10^{15} \sim 10^{16}$ ions/cm$^3$ and the implantation energy is around 3~50 KeV.

* * * * *